United States Patent
Huisenga et al.

(10) Patent No.: US 7,018,800 B2
(45) Date of Patent: Mar. 28, 2006

(54) PROCESS DEVICE WITH QUIESCENT CURRENT DIAGNOSTICS

(75) Inventors: Garrie D. Huisenga, Chaska, MN (US); Randy J. Longsdorf, Chaska, MN (US)

(73) Assignee: Rosemount Inc., Eden Prairie, MN (US)

( * ) Notice: Subject to any disclaimer, the term of this patent is extended or adjusted under 35 U.S.C. 154(b) by 342 days.

(21) Appl. No.: 10/635,944

(22) Filed: Aug. 7, 2003

(65) Prior Publication Data
US 2005/0030185 A1 Feb. 10, 2005

(51) Int. Cl.
*C12Q 1/68* (2006.01)
*G08B 21/00* (2006.01)

(52) U.S. Cl. ............................ 435/6; 340/664; 324/763
(58) Field of Classification Search ................. 435/6; 340/635, 664, 657, 650; 324/763, 765
See application file for complete search history.

(56) References Cited

U.S. PATENT DOCUMENTS

| | | | |
|---|---|---|---|
| 3,096,434 A | 7/1963 | King ........................... 235/151 |
| 3,404,264 A | 10/1968 | Kugler ........................ 235/194 |
| 3,468,164 A | 9/1969 | Sutherland .................... 73/343 |
| 3,590,370 A | 6/1971 | Fleischer ...................... 324/51 |
| 3,618,592 A | 11/1971 | Stewart .................. 128/2.05 R |
| 3,688,190 A | 8/1972 | Blum ......................... 324/61 R |
| 3,691,842 A | 9/1972 | Akeley ....................... 73/398 C |
| 3,701,280 A | 10/1972 | Stroman ........................ 73/194 |
| 3,849,637 A | 11/1974 | Caruso et al. ............... 235/151 |
| 3,855,858 A | 12/1974 | Cushing ................ 73/194 EM |
| 3,948,098 A * | 4/1976 | Richardson et al. ..... 73/861.24 |
| 3,952,759 A | 4/1976 | Ottenstein ..................... 137/12 |
| 3,959,772 A | 5/1976 | Wakasa et al. .............. 340/167 |
| 3,973,184 A | 8/1976 | Raber ........................... 324/51 |
| 4,020,416 A | 4/1977 | Ottos .......................... 324/703 |
| RE29,383 E | 9/1977 | Gallatin et al. ............... 137/14 |
| 4,058,975 A | 11/1977 | Gilbert et al. ............. 60/39.28 |
| 4,086,570 A | 4/1978 | Wakasa et al. .............. 340/172 |
| 4,099,413 A | 7/1978 | Ohte et al. ..................... 73/359 |
| 4,102,199 A | 7/1978 | Tsipouras ..................... 73/362 |
| 4,122,719 A | 10/1978 | Carlson et al. ............... 73/342 |
| 4,249,164 A | 2/1981 | Tivy ........................ 340/870.3 |
| 4,250,490 A | 2/1981 | Dahlke .................. 340/870.37 |
| 4,279,013 A | 7/1981 | Cameron et al. ...... 340/870.37 |
| 4,337,516 A | 6/1982 | Murphy et al. ............. 364/551 |
| 4,399,824 A | 8/1983 | Davidson .................... 128/736 |

(Continued)

FOREIGN PATENT DOCUMENTS

| CA | 999950 | 11/1976 |
|---|---|---|
| DE | 32 13 866 A1 | 10/1983 |
| DE | 35 40 204 C1 | 9/1986 |

(Continued)

OTHER PUBLICATIONS

U.S. Appl. No. 10/893,144, filed Jul. 2004, Brown et al.
U.S. Appl. No. 10/733,558, filed Dec. 11, 2003.
U.S. Appl. No. 10/719,163, filed Nov. 21, 2003.
"Functional Safety and Safety Integrity Levels", *Applications Note*, Apr. 2002, pp. 1–6.

(Continued)

*Primary Examiner*—John Tweel, Jr.
(74) *Attorney, Agent, or Firm*—Westman, Champlin & Kelly, P.A.

(57) ABSTRACT

A process device for use on an industrial process control system includes a quiescent current sensor configured to sense quiescent current draw of the process device. Diagnostic circuitry determines a diagnostic condition of the process device as a function of the sensed quiescent current.

42 Claims, 4 Drawing Sheets

U.S. PATENT DOCUMENTS

| | | | |
|---|---|---|---|
| 4,403,297 A | 9/1983 | Tivy | 364/579 |
| 4,417,312 A | 11/1983 | Cronin et al. | 364/510 |
| 4,459,858 A * | 7/1984 | Marsh | 73/861.12 |
| 4,463,612 A * | 8/1984 | Thompson | 73/861.22 |
| 4,517,468 A | 5/1985 | Kemper et al. | 290/52 |
| 4,528,869 A | 7/1985 | Kubo et al. | 74/695 |
| 4,530,234 A | 7/1985 | Cullick et al. | 73/53 |
| 4,540,468 A | 9/1985 | Genco et al. | 162/49 |
| 4,571,689 A | 2/1986 | Hildebrand et al. | 364/481 |
| 4,630,265 A | 12/1986 | Sexton | 370/85 |
| 4,635,214 A | 1/1987 | Kasai et al. | 364/551 |
| 4,642,782 A | 2/1987 | Kemper et al. | 364/550 |
| 4,644,479 A | 2/1987 | Kemper et al. | 364/550 |
| 4,649,515 A | 3/1987 | Thompson et al. | 364/900 |
| 4,668,473 A | 5/1987 | Agarwal | 422/62 |
| 4,686,638 A | 8/1987 | Furuse | 364/558 |
| 4,707,796 A | 11/1987 | Calabro et al. | 364/552 |
| 4,720,806 A | 1/1988 | Schippers et al. | 364/551 |
| 4,736,367 A | 4/1988 | Wroblewski et al. | 370/85 |
| 4,736,763 A | 4/1988 | Britton et al. | 137/10 |
| 4,758,308 A | 7/1988 | Carr | 162/263 |
| 4,777,585 A | 10/1988 | Kokawa et al. | 364/164 |
| 4,804,958 A | 2/1989 | Longsdorf | 340/870.07 |
| 4,807,151 A | 2/1989 | Citron | 364/510 |
| 4,818,994 A | 4/1989 | Orth et al. | 340/501 |
| 4,831,564 A | 5/1989 | Suga | 364/551.01 |
| 4,841,286 A | 6/1989 | Kummer | 340/653 |
| 4,853,693 A | 8/1989 | Eaton-Williams | 340/588 |
| 4,873,655 A | 10/1989 | Kondraske | 364/553 |
| 4,907,167 A | 3/1990 | Skeirik | 364/500 |
| 4,924,418 A | 5/1990 | Backman et al. | 364/550 |
| 4,926,364 A | 5/1990 | Brotherton | 364/581 |
| 4,934,196 A | 6/1990 | Romano | 73/861.38 |
| 4,939,753 A | 7/1990 | Olson | 375/107 |
| 4,964,125 A | 10/1990 | Kim | 371/15.1 |
| 4,988,990 A | 1/1991 | Warrior | 340/25.5 |
| 4,992,965 A | 2/1991 | Holter et al. | 364/551.01 |
| 5,005,142 A | 4/1991 | Lipchak et al. | 364/550 |
| 5,019,760 A | 5/1991 | Chu et al. | 318/490 |
| 5,025,344 A * | 6/1991 | Maly et al. | 361/88 |
| 5,043,862 A | 8/1991 | Takahashi et al. | 364/162 |
| 5,053,815 A | 10/1991 | Wendell | 355/208 |
| 5,057,774 A * | 10/1991 | Verhelst et al. | 324/537 |
| 5,067,099 A | 11/1991 | McCown et al. | 364/550 |
| 5,081,598 A | 1/1992 | Bellows et al. | 364/550 |
| 5,089,979 A | 2/1992 | McEachern et al. | 364/571.04 |
| 5,089,984 A | 2/1992 | Struger et al. | 395/650 |
| 5,098,197 A | 3/1992 | Shepard et al. | 374/120 |
| 5,099,436 A | 3/1992 | McCown et al. | 364/550 |
| 5,103,409 A | 4/1992 | Shimizu et al. | 364/556 |
| 5,111,531 A | 5/1992 | Grayson et al. | 395/23 |
| 5,121,467 A | 6/1992 | Skeirik | 395/11 |
| 5,122,794 A | 6/1992 | Warrior | 340/825.2 |
| 5,122,976 A | 6/1992 | Bellows et al. | 364/550 |
| 5,130,936 A | 7/1992 | Sheppard et al. | 364/551.01 |
| 5,134,574 A | 7/1992 | Beaverstock et al. | 364/551.01 |
| 5,137,370 A | 8/1992 | McCullock et al. | 374/173 |
| 5,142,612 A | 8/1992 | Skeirik | 395/11 |
| 5,143,452 A | 9/1992 | Maxedon et al. | 374/170 |
| 5,148,378 A | 9/1992 | Shibayama et al. | 364/551.07 |
| 5,150,289 A | 9/1992 | Badavas | 364/154 |
| 5,167,009 A | 11/1992 | Skeirik | 395/27 |
| 5,175,678 A | 12/1992 | Frerichs et al. | 364/148 |
| 5,193,143 A | 3/1993 | Kaemmerer et al. | 395/51 |
| 5,197,114 A | 3/1993 | Skeirik | 395/22 |
| 5,197,328 A | 3/1993 | Fitzgerald | 73/168 |
| 5,212,765 A | 5/1993 | Skeirik | 395/11 |
| 5,214,582 A | 5/1993 | Gray | 364/424.03 |
| 5,216,226 A | 6/1993 | Miyoshi | 219/497 |
| 5,223,798 A | 6/1993 | McGinnis et al. | 324/713 |
| 5,224,203 A | 6/1993 | Skeirik | 395/22 |
| 5,228,780 A | 7/1993 | Shepard et al. | 374/175 |
| 5,235,527 A | 8/1993 | Ogawa et al. | 364/571.05 |
| 5,265,031 A | 11/1993 | Malczewski | 364/497 |
| 5,265,222 A | 11/1993 | Nishiya et al. | 395/3 |
| 5,269,311 A | 12/1993 | Kirchner et al. | 128/672 |
| 5,274,572 A | 12/1993 | O'Neill et al. | 364/550 |
| 5,282,131 A | 1/1994 | Rudd et al. | 364/164 |
| 5,282,261 A | 1/1994 | Skeirik | 395/22 |
| 5,293,585 A | 3/1994 | Morita | 395/52 |
| 5,303,181 A | 4/1994 | Stockton | 365/96 |
| 5,305,230 A | 4/1994 | Matsumoto et al. | 364/495 |
| 5,311,421 A | 5/1994 | Nomura et al. | 364/157 |
| 5,317,520 A | 5/1994 | Castle | 364/482 |
| 5,327,357 A | 7/1994 | Feinstein et al. | 364/502 |
| 5,333,240 A | 7/1994 | Matsumoto et al. | 395/23 |
| 5,339,025 A | 8/1994 | Jones et al. | 324/713 |
| 5,340,271 A | 8/1994 | Freeman et al. | 415/1 |
| 5,347,843 A | 9/1994 | Orr et al. | 73/3 |
| 5,349,541 A | 9/1994 | Alexandro, Jr. et al. | 364/578 |
| 5,357,449 A | 10/1994 | Oh | 364/551.01 |
| 5,361,628 A | 11/1994 | Marko et al. | 73/116 |
| 5,365,423 A | 11/1994 | Chand | 364/140 |
| 5,365,787 A | 11/1994 | Hernandez et al. | 73/660 |
| 5,367,612 A | 11/1994 | Bozich et al. | 395/22 |
| 5,382,912 A | 1/1995 | Blain | 324/713 |
| 5,384,699 A | 1/1995 | Levy et al. | 364/413.13 |
| 5,386,188 A | 1/1995 | Minneman et al. | 327/704 |
| 5,386,373 A | 1/1995 | Keeler et al. | 364/577 |
| 5,388,465 A | 2/1995 | Okaniwa et al. | 73/861.17 |
| 5,392,293 A * | 2/1995 | Hsue | 324/765 |
| 5,394,341 A | 2/1995 | Kepner | 364/551.01 |
| 5,394,543 A | 2/1995 | Hill et al. | 395/575 |
| 5,404,064 A | 4/1995 | Mermelstein et al. | 310/319 |
| 5,408,406 A | 4/1995 | Mathur et al. | 364/163 |
| 5,408,586 A | 4/1995 | Skeirik | 395/23 |
| 5,410,495 A | 4/1995 | Ramamurthi | 364/511.05 |
| 5,414,645 A | 5/1995 | Hirano | 364/551.01 |
| 5,419,197 A | 5/1995 | Ogi et al. | 73/659 |
| 5,430,642 A | 7/1995 | Nakajima et al. | 364/148 |
| 5,434,774 A | 7/1995 | Seberger | 364/172 |
| 5,436,705 A | 7/1995 | Raj | 355/246 |
| 5,440,478 A | 8/1995 | Fisher et al. | 364/188 |
| 5,442,639 A | 8/1995 | Crowder et al. | 371/20.1 |
| 5,467,355 A | 11/1995 | Umeda et al. | 364/571.04 |
| 5,469,070 A | 11/1995 | Koluvek | 324/713 |
| 5,469,156 A | 11/1995 | Kogure | 340/870.38 |
| 5,469,735 A | 11/1995 | Watanabe | 73/118.1 |
| 5,469,749 A | 11/1995 | Shimada et al. | 73/861.47 |
| 5,481,199 A | 1/1996 | Anderson et al. | 324/705 |
| 5,481,200 A | 1/1996 | Voegele et al. | 324/718 |
| 5,483,387 A | 1/1996 | Bauhahn et al. | 359/885 |
| 5,485,753 A | 1/1996 | Burns et al. | 73/720 |
| 5,486,996 A | 1/1996 | Samad et al. | 364/152 |
| 5,488,697 A | 1/1996 | Kaemmerer et al. | 395/51 |
| 5,489,831 A | 2/1996 | Harris | 318/701 |
| 5,495,769 A | 3/1996 | Broden et al. | 73/718 |
| 5,510,779 A | 4/1996 | Maltby et al. | 340/870.3 |
| 5,511,004 A | 4/1996 | Dubost et al. | 364/551.01 |
| 5,526,293 A | 6/1996 | Mozumder et al. | 364/578 |
| 5,539,638 A | 7/1996 | Keeler et al. | 364/424.03 |
| 5,548,528 A | 8/1996 | Keeler et al. | 364/497 |
| 5,555,190 A | 9/1996 | Derby et al. | 364/510 |
| 5,560,246 A | 10/1996 | Bottinger et al. | 73/861.15 |
| 5,561,599 A | 10/1996 | Lu | 364/164 |
| 5,570,034 A * | 10/1996 | Needham et al. | 324/763 |
| 5,570,300 A | 10/1996 | Henry et al. | 364/551.01 |
| 5,572,420 A | 11/1996 | Lu | 364/153 |
| 5,573,032 A | 11/1996 | Lenz et al. | 137/486 |
| 5,591,922 A | 1/1997 | Segeral et al. | 73/861.04 |
| 5,598,521 A | 1/1997 | Kilgore et al. | 395/326 |

| | | | |
|---|---|---|---|
| 5,600,148 A | 2/1997 | Cole et al. ............... 250/495.1 |
| 5,608,650 A | 3/1997 | McClendon et al. ........ 364/510 |
| 5,623,605 A | 4/1997 | Keshav et al. .......... 395/200.17 |
| 5,629,870 A | 5/1997 | Farag et al. ............ 364/551.01 |
| 5,633,809 A | 5/1997 | Wissenbach et al. ........ 364/510 |
| 5,637,802 A | 6/1997 | Frick et al. ................... 73/724 |
| 5,640,491 A | 6/1997 | Bhat et al. ..................... 395/22 |
| 5,654,869 A | 8/1997 | Ohi et al. ..................... 361/540 |
| 5,661,668 A | 8/1997 | Yemini et al. ............... 364/550 |
| 5,665,899 A | 9/1997 | Willcox ....................... 73/1.63 |
| 5,669,713 A | 9/1997 | Schwartz et al. .............. 374/1 |
| 5,671,335 A | 9/1997 | Davis et al. ................... 395/23 |
| 5,672,247 A | 9/1997 | Pangalos et al. ............. 162/65 |
| 5,675,504 A | 10/1997 | Serodes et al. ............. 364/496 |
| 5,675,724 A | 10/1997 | Beal et al. ............. 395/182.02 |
| 5,680,109 A | 10/1997 | Lowe et al. ................. 340/608 |
| 5,682,317 A | 10/1997 | Keeler et al. .......... 364/431.03 |
| 5,700,090 A | 12/1997 | Eryurek ........................ 374/210 |
| 5,703,575 A | 12/1997 | Kirkpatrick ............ 340/870.17 |
| 5,704,011 A | 12/1997 | Hansen et al. ................. 395/22 |
| 5,705,978 A | 1/1998 | Frick et al. .................. 340/511 |
| 5,708,211 A | 1/1998 | Jepson et al. ............. 73/861.04 |
| 5,708,585 A | 1/1998 | Kushion .............. 364/431.061 |
| 5,710,370 A | 1/1998 | Shanahan et al. ........... 73/1.35 |
| 5,710,708 A | 1/1998 | Wiegland ................ 364/470.1 |
| 5,713,668 A | 2/1998 | Lunghofer et al. .......... 374/179 |
| 5,719,378 A | 2/1998 | Jackson, Jr. et al. ........ 219/497 |
| 5,736,649 A | 4/1998 | Kawasaki et al. ........ 73/861.23 |
| 5,741,074 A | 4/1998 | Wang et al. ................. 374/185 |
| 5,742,845 A | 4/1998 | Wagner ........................ 395/831 |
| 5,746,511 A | 5/1998 | Eryurek et al. ................. 374/2 |
| 5,747,701 A | 5/1998 | Marsh et al. ............. 73/861.23 |
| 5,752,008 A | 5/1998 | Bowling ...................... 395/500 |
| 5,764,539 A | 6/1998 | Rani ........................... 364/557 |
| 5,764,891 A | 6/1998 | Warrior .................... 395/200.2 |
| 5,781,024 A * | 7/1998 | Kurkowski et al. ......... 324/763 |
| 5,781,878 A | 7/1998 | Mizoguchi et al. .......... 701/109 |
| 5,790,413 A | 8/1998 | Bartusiak et al. ........... 364/485 |
| 5,801,689 A | 9/1998 | Huntsman ................... 345/329 |
| 5,805,442 A | 9/1998 | Crater et al. ................. 364/138 |
| 5,817,950 A | 10/1998 | Wiklund et al. .......... 73/861.66 |
| 5,825,664 A | 10/1998 | Warrior et al. ................... 700/7 |
| 5,828,567 A | 10/1998 | Eryurek et al. ............... 700/79 |
| 5,829,876 A | 11/1998 | Schwartz et al. ................ 374/1 |
| 5,848,383 A | 12/1998 | Yuuns ......................... 702/102 |
| 5,859,964 A | 1/1999 | Wang et al. ............. 395/185.01 |
| 5,869,772 A * | 2/1999 | Storer ..................... 73/861.24 |
| 5,876,122 A | 3/1999 | Eryurek ...................... 374/183 |
| 5,880,376 A | 3/1999 | Sai et al. .................. 73/861.08 |
| 5,887,978 A | 3/1999 | Lunghofer et al. ......... 374/179 |
| 5,908,990 A | 6/1999 | Cummings ............... 73/861.22 |
| 5,923,557 A | 7/1999 | Eidson .................. 364/471.03 |
| 5,924,086 A | 7/1999 | Mathur et al. ................. 706/25 |
| 5,926,778 A | 7/1999 | Pöppel ........................ 702/130 |
| 5,936,514 A | 8/1999 | Anderson et al. ....... 340/310.01 |
| 5,940,290 A | 8/1999 | Dixon ........................ 364/138 |
| 5,956,663 A | 9/1999 | Eryurek et al. .............. 702/183 |
| 5,970,430 A | 10/1999 | Burns et al. ................. 702/122 |
| 6,002,952 A * | 12/1999 | Diab et al. .................. 600/310 |
| 6,010,612 A * | 1/2000 | Larson et al. ............... 702/183 |
| 6,014,902 A | 1/2000 | Lewis et al. ............. 73/861.12 |
| 6,016,523 A | 1/2000 | Zimmerman et al. ......... 710/63 |
| 6,016,706 A | 1/2000 | Yamamoto et al. ................ 9/6 |
| 6,017,143 A | 1/2000 | Eryurek et al. ............... 700/51 |
| 6,023,399 A | 2/2000 | Kogure ........................ 361/23 |
| 6,038,579 A | 3/2000 | Sekine ........................ 708/400 |
| 6,045,260 A | 4/2000 | Schwartz et al. ........... 374/183 |
| 6,046,642 A * | 4/2000 | Brayton et al. ............. 330/296 |
| 6,047,220 A | 4/2000 | Eryurek et al. ............... 700/28 |
| 6,047,222 A | 4/2000 | Burns et al. ................... 700/79 |
| 6,052,655 A | 4/2000 | Kobayashi et al. .......... 702/184 |

| | | | |
|---|---|---|---|
| 6,061,603 A | 5/2000 | Papadopoulos et al. ........ 700/83 |
| 6,072,150 A | 6/2000 | Sheffer ................... 219/121.83 |
| 6,112,131 A | 8/2000 | Ghorashi et al. ............ 700/142 |
| 6,119,047 A | 9/2000 | Eryurek et al. ................ 700/28 |
| 6,119,529 A | 9/2000 | Di Marco et al. ........ 73/861.68 |
| 6,139,180 A | 10/2000 | Usher et al. ..................... 374/1 |
| 6,151,560 A | 11/2000 | Jones ........................... 702/58 |
| 6,182,501 B1 | 2/2001 | Furuse et al. ................. 73/49.2 |
| 6,192,281 B1 | 2/2001 | Brown et al. ................... 700/2 |
| 6,195,591 B1 | 2/2001 | Nixon et al. .................... 700/2 |
| 6,199,018 B1 | 3/2001 | Quist et al. .................... 702/34 |
| 6,209,048 B1 | 3/2001 | Wolff .......................... 710/62 |
| 6,236,948 B1 | 5/2001 | Eck et al. ...................... 702/45 |
| 6,263,487 B1 | 7/2001 | Stripf et al. .................... 717/1 |
| 6,272,438 B1 | 8/2001 | Cunningham et al. ......... 702/56 |
| 6,298,377 B1 | 10/2001 | Hartikainen et al. ......... 709/223 |
| 6,307,483 B1 | 10/2001 | Westfield et al. ....... 340/870.11 |
| 6,311,136 B1 | 10/2001 | Henry et al. ................... 702/45 |
| 6,317,701 B1 | 11/2001 | Pyostsia et al. ............. 702/188 |
| 6,327,914 B1 | 12/2001 | Dutton .................... 73/861.356 |
| 6,347,252 B1 | 2/2002 | Behr et al. ...................... 700/2 |
| 6,360,277 B1 | 3/2002 | Ruckley et al. ................ 9/250 |
| 6,370,448 B1 | 4/2002 | Eryurek ........................ 700/19 |
| 6,377,859 B1 | 4/2002 | Brown et al. .................. 700/79 |
| 6,397,114 B1 | 5/2002 | Eryurek et al. ............... 700/32 |
| 6,405,099 B1 | 6/2002 | Nagai et al. ................. 700/159 |
| 6,425,038 B1 | 7/2002 | Sprecher ..................... 710/269 |
| 6,473,656 B1 | 10/2002 | Langels et al. ............... 700/17 |
| 6,480,793 B1 | 11/2002 | Martin ........................ 702/45 |
| 6,539,267 B1 | 3/2003 | Eryurek et al. ............. 700/51 |
| 2002/0013629 A1 | 1/2002 | Nixon et al. |
| 2002/0121910 A1 | 9/2002 | Rome et al. ................. 324/718 |
| 2002/0145568 A1 | 10/2002 | Winter ........................ 343/701 |
| 2003/0033040 A1 | 2/2003 | Billings ........................ 700/97 |
| 2003/0045962 A1 | 3/2003 | Eryurek et al. ............. 700/128 |

FOREIGN PATENT DOCUMENTS

| | | |
|---|---|---|
| DE | 40 08 560 A1 | 9/1990 |
| DE | 42 09 785 A1 | 9/1993 |
| DE | 43 43 747 | 6/1994 |
| DE | 44 33 593 A1 | 6/1995 |
| DE | 195 02 499 A1 | 8/1996 |
| DE | 296 00 609 U1 | 3/1997 |
| DE | 197 04 694 A1 | 8/1997 |
| DE | 19930660 A1 | 7/1999 |
| DE | 199 05 071 | 8/2000 |
| DE | 19905071 A1 * | 8/2000 |
| DE | 299 17 651 U1 | 12/2000 |
| DE | 100 36 971 A1 | 2/2002 |
| EP | 0 122 622 A1 | 10/1984 |
| EP | 0 413 814 A1 | 2/1991 |
| EP | 0 487 419 A2 | 5/1992 |
| EP | 0 512 794 A2 | 11/1992 |
| EP | 0 594 227 A1 | 4/1994 |
| EP | 0 624 847 A1 | 11/1994 |
| EP | 0 644 470 A2 | 3/1995 |
| EP | 0 825 506 A2 | 7/1997 |
| EP | 0 827 096 A2 | 9/1997 |
| EP | 0 838 768 A2 | 9/1997 |
| EP | 0 807 804 A2 | 11/1997 |
| EP | 1 058 093 A1 | 5/1999 |
| EP | 1 022 626 A2 | 7/2000 |
| FR | 2 302 514 | 9/1976 |
| FR | 2 334 827 | 7/1977 |
| GB | 928704 | 6/1963 |
| GB | 1 534 280 | 11/1978 |
| GB | 1 534 288 | 11/1978 |
| GB | 2 310 346 A | 8/1997 |
| GB | 2 342 453 A | 4/2000 |
| GB | 2 347 232 A | 8/2000 |
| JP | 58-129316 | 8/1983 |

| JP | 59-116811 | 7/1984 |
| JP | 59-163520 | 9/1984 |
| JP | 59-211196 | 11/1984 |
| JP | 59-211896 | 11/1984 |
| JP | 60-000507 | 1/1985 |
| JP | 60-76619 | 5/1985 |
| JP | 60-131495 | 7/1985 |
| JP | 60-174915 | 9/1985 |
| JP | 62-30915 | 2/1987 |
| JP | 64-01914 | 1/1989 |
| JP | 64-72699 | 3/1989 |
| JP | 2-05105 | 1/1990 |
| JP | 3-229124 | 10/1991 |
| JP | 5-122768 | 5/1993 |
| JP | 06242192 | 9/1994 |
| JP | 06-248224 | 10/1994 |
| JP | 7-063586 | 3/1995 |
| JP | 07234988 | 9/1995 |
| JP | 8-054923 | 2/1996 |
| JP | 8-102241 | 4/1996 |
| JP | 8-136386 | 5/1996 |
| JP | 8-166309 | 6/1996 |
| JP | 8-247076 | 9/1996 |
| JP | 8-313466 | 11/1996 |
| JP | 2712625 | 10/1997 |
| JP | 2712701 | 10/1997 |
| JP | 2753592 | 3/1998 |
| JP | 07225530 | 5/1998 |
| JP | 10-232170 | 9/1998 |
| JP | 11-083575 | 3/1999 |
| WO | WO 94/25933 | 11/1994 |
| WO | WO 96/11389 | 4/1996 |
| WO | WO 96/12993 | 5/1996 |
| WO | WO 96/39617 | 12/1996 |
| WO | WO 97/21157 | 6/1997 |
| WO | WO 97/25603 | 7/1997 |
| WO | WO 98/06024 | 2/1998 |
| WO | WO 98/13677 | 4/1998 |
| WO | WO 98/14855 | 4/1998 |
| WO | WO 98/20469 | 5/1998 |
| WO | WO 98/39718 | 9/1998 |
| WO | WO 99/19782 | 4/1999 |
| WO | WO 00/41050 | 7/2000 |
| WO | WO 00/55700 | 9/2000 |
| WO | WO 00/70531 | 11/2000 |
| WO | WO 01/01213 A1 | 1/2001 |
| WO | WO 01/77766 | 10/2001 |
| WO | WO 02/27418 | 4/2002 |
| WO | WO 03/040657 A2 | 5/2003 |
| WO | WO 03/040851 A2 | 5/2003 |
| WO | WO 03/060851 A1 | 7/2003 |

OTHER PUBLICATIONS

Article entitled "Safety Field*TT*2600T Pressure Transmitter Family", *ABB Instrumentation Spa*, 29 pages.
U.S. Appl. No. 09/169,873, filed Oct. 12, 1998, Eryurek et al.
U.S. Appl. No. 09/175,832, filed Oct. 19, 1998, Eryurek et al.
U.S. Appl. No. 09/257,896, filed Feb. 25, 1999, Eryurek et al.
U.S. Appl. No. 09/303,869, filed May 3, 1999, Eryurek et al.
U.S. Appl. No. 09/335,212, filed Jun. 17, 1999, Kirkpatrick et al.
U.S. Appl. No. 09/344,631, filed Jun. 25, 1999, Eryurek et al.
U.S. Appl. No. 09/360,473, filed Jul. 23, 1999, Eryurek et al.
U.S. Appl. No. 09/369,530, filed Aug. 6, 1999, Eryurek et al.
U.S. Appl. No. 09/383,828, filed Aug. 27, 1999, Eryurek et al.
U.S. Appl. No. 09/384,876, filed Aug. 27, 1999, Eryurek et al.
U.S. Appl. No. 09/406,263, filed Sep. 24, 1999, Kirkpatrick et al.
U.S. Appl. No. 09/409,098, filed Sep. 30, 1999, Eryurek et al.
U.S. Appl. No. 09/409,114, filed Sep. 30, 1999, Eryurek et al.
U.S. Appl. No. 09/565,604, filed May 4, 2000, Eruyrek et al.
U.S. Appl. No. 09/576,450, filed May 23, 2000, David L. Wehrs.
U.S. Appl. No. 09/606,259, filed Jun. 29, 2000, Evren Eryurek.
U.S. Appl. No. 09/616,118, filed Jul. 14, 2000, Eryurek et al.
U.S. Appl. No. 09/627,543, filed Jul. 28, 2000, Eryurek et al.
U.S. Appl. No. 09/576,719, filed May 23, 2000, Coursolle et al.
U.S. Appl. No. 09/799,824, filed Mar. 5, 2001, Rome et al.
U.S. Appl. No. 09/855,179, filed May 14, 2001, Eryurek et al.
U.S. Appl. No. 09/852,102, filed May 9, 2001, Eryurek et al.
"A TCPåIP Tutorial" by, Socolofsky et al., Spider Systems Limited, Jan. 1991 pp. 1–23.
"Approval Standards For Explosionproof Electrical Equipment General Requirements", Factory Mutual Research, Cl. No. 3615, Mar. 1989, pp. 1–34.
"Approval Standard Intrinsically Safe Apparatus and Associated Apparatus For Use In Class I, II, and III, Division 1 Hazardous (Classified) Locations", Factory Mutual Research, Cl. No. 3610, Oct. 1988, pp. 1–70.
"Automation On–line" by, Phillips et al., Plant Services, Jul. 1997, pp. 41–45.
"Climb to New Heights by Controlling your PLCs Over the Internet" by, Phillips et al., Intech, Aug. 1998, pp. 50–51.
"CompProcessor For Piezoresistive Sensors" MCA Technologies Inc. (MCA7707), pp. 1–8.
"Ethernet emerges as viable, inexpensive fieldbus", Paul G. Schreier, Personal Engineering, Dec. 1997, p. 23–29.
"Ethernet Rules Closed–loop System" by, Eidson et al., Intech, Jun. 1998, pp. 39–42.
"Fieldbus Standard for Use in Industrial Control Systems Part 2: Physical Layer Specification and Service Definition", ISA–S50.02–1992, pp. 1–93.
"Fieldbus Standard for Use in Industrial Control Systems Part 3: Data Link Service Definition", ISA–S50.02–1997, Part 3, Aug. 1997, pp. 1–159.
Fieldbus Standard For Use in Industrial Control Systems Part 4: Data Link Protocol Specification, ISA–S50.02–1997, Part 4, Aug. 1997, pp. 1–148.
"Fieldbus Support For Process Analysis" by, Blevins et al., Fisher–Rosemount Systems, Inc., 1995, pp. 121–128.
"Fieldbus Technical Overview Understanding FOUNDATION™ fieldbus technology", Fisher–Rosemount, 1998, pp. 1–23.
"Hypertext Transfer Protocol—HTTP/1.0" by, Berners–Lee et al., MIT/LCS, May 1996, pp. 1–54.
"Infranets, Intranets, and the Internet" by, Pradip Madan, Echelon Corp, Sensors, Mar. 1997, pp. 46–50.
"Internet Technology Adoption into Automation" by, Fondl et al., Automation Business, pp. 1–5.

"Internet Protocol Darpa Internet Program Protocol Specification" by, Information Sciences Institute, University of Southern California, RFC 791, Sep. 1981, pp. 1–43.

"Introduction to Emit", emWare, Inc., 1997, pp. 1–22.

"Introduction to the Internet Protocols" by, Charles L. Hedrick, Computer Science Facilities Group, Rutgers University, Oct. 3, 1988, pp. 1–97.

"Is There A Future For Ethernet in Industrial Control?", Miclot et al., Plant Engineering, Oct. 1988, pp. 44–46, 48, 50.

LFM/SIMA Internet Remote Diagnostics Research Project Summary Report, Stanford University, Jan. 23, 1997, pp. 1–6.

"Managing Devices with the Web" by, Howard et al., Byte, Sep. 1997, pp. 45–64.

"Modular Microkernel Links GUI And Browser For Embedded Web Devices" by, Tom Williams, pp. 1–2.

"PC Software Gets Its Edge From Windows, Components, and the Internet", Wayne Labs, I&CS, Mar. 1997, pp. 23–32.

Proceedings Sensor Expo. Aneheim, California, Produced by Expocon Management Associates, Inc., Apr. 1996, pp. 9–21.

Proceedings Sensor Expo, Boston, Massachuttes, Produced by Expocon Management Associates, Inc., May 1997, pp. 1–416.

"Smart Sensor Network of the Future" by, Jay Warrior, Sensors, Mar. 1997, pp. 40–45.

"The Embedded Web Site" by, John R. Hines, IEEE Spectrum, Sep. 1996, p. 23.

"Transmission Control Protocol: Darpa Internet Program Protocol Specification" Information Sciences Institute, Sep. 1981, pp. 1–69.

"On–Line Statistical Process Control for a Glass Tank Ingredient Scale," by R.A. Weisman, *IFAC real Time Programming*, 1985, pp. 29–38.

"The Performance of Control Charts for Monitoring Process Variation," by C. Lowry et al., *Commun. Statis.—Simula.*, 1995, pp. 409–437.

"A Knowledge–Based Approach for Detection and Diagnosis of Out–Of–Control Events in Manufacturing Processes," by P. Love et al., *IEEE*, 1989, pp. 736–741.

"Advanced Engine Diagnostics Using Universal Process Modeling", by P. O'Sullivan, *Presented at the 1996 SAE Conference on Future Transportation Technology*, pp. 1–9.

Parallel, Fault–Tolerant Control and Diagnostics System for Feedwater Regulation in PWRS, by E. Eryurek et al., *Proceedings of the American Power Conference*.

"Programmable Hardware Architectures for Sensor Validation", by M.P. Henry et al., *Control Eng. Practice*, vol. 4, No. 10., pp. 1339–1354, (1996).

"Sensor Validation for Power Plants Using Adaptive Backpropagation Neural Network," *IEEE Transactions on Nuclear Science*, vol. 37, No. 2, by E. Eryurek et al. Apr. 1990, pp. 1040–1047.

"Signal Processing, Data Handling and Communications: The Case for Measurement Validation", by M.P. Henry, *Department of Engineering Science, Oxford University*.

"Smart Temperture Measurement in the '90s", by T. Kerlin et al., *C&I*, (1990).

"Software–Based Fault–Tolerant Control Design for Improved Power Plant Operation," *IEEE/IFAC Joint Symposium on Computer–Aided Control System Design*, Mar. 7–9, 1994 pp. 585–590.

A Standard Interface for Self–Validating Sensors, by M.P. Henry et al., *Report No. QUEL 1884/91*, (1991).

"Taking Full Advantage for Smart Transmitter Technology Now," by G. Orrison, *Control Engineering*, vol. 42, No. 1, Jan. 1995.

"Using Artificial Neural Networks to Identify Nuclear Power Plant States," by Israel E. Alguindigue et al., pp. 1–4.

"Application of Neural Computing Paradigms for Signal Validation," by B.R. Upadhyaya et al., *Department of Nuclear Engineering*, pp. 1–18.

"Application of Neural Networks for Sensor Validation and Plant Monitoring," by B. Upadhyaya et al., *Nuclear Technology*, vol. 97, No. 2, Feb. 1992 pp. 170–176.

"Automated Generation of Nonlinear System Characterization for Sensor Failure Detection," by B.R. Upadhyaya et al., *ISA*, 1989 pp. 269–274.

"In Situ Calibration of Nuclear Plant Platinum Resistance Thermometers Using Johnson Noise Methods," *EPRI*, Jun. 1983.

"Johnson Noise Thermometer for High Radiation and High–Temperature Environments," by L. Oakes et al., *Fifth Symposium on Space Nuclear Power Systems*, Jan. 1988, pp. 2–23.

"Development of a Resistance Thermometer For Use Up to 1600° C.", by M.J. de Groot et al., *CAL LAB*, Jul./Aug. 1996, pp. 38–41.

"Survey, Applications, And Prospects of Johnson Noise Thermometry," by T. Blalock et al., *Electrical Engineering Department*, 1981 pp. 2–11.

"Noise Thermometry for Industrial and Metrological Applications at KFA Julich," by H. Brixy et al., *7th International Symposium on Temperature*, 1992.

"Johnson Noise Power Thermometer and its Application in Process Temperature Measurement," by T.V. Blalock et al., *American Institute of Physics* 1982, pp. 1249–1259.

"Field–based Architecture is Based on Open Systems, Improves Plant Performance", by P. Cleaveland, *I&CS*, Aug. 1996, pp. 73–74.

"Tuned–Circuit Dual–Mode Johnson Noise Thermometers," by R.L. Shepard et al., Apr. 1992.

"Turned–Circuit Johnson Noise Thermometry," by Michael Roberts et al., $7^{th}$ *Symposium on Space Nuclear Power Systems*, Jan. 1990.

"Smart Field Devices Provide New Process Data, Increase System Flexibility," by Mark Boland, *I&CS*, Nov. 1994, pp. 45–51.

"Wavelet Analysis of Vibration, Part I: Theory[1]," by D.E. Newland, *Journal of Vibration and Acoustics*, vol. 116, Oct. 1994, pp. 409–416.

"Wavelet Analysis of Vibration, Part 2: Wavelet Maps," by D.E. Newland, *Journal of Vibration and Acoustics*, vol. 116, Oct. 1994, pp. 417–425.

"Development of a Long–Life, High–Reliability Remotely Operated Johnson Noise Thermometer," by R.L. Shepard et al., *ISA*, 1991, pp. 77–84.

"Application of Johnson Noise Thermometry to Space Nuclear Reactors," by M.J. Roberts et al., *Presented at the 6th Symposium on Space Nuclear Power Systems*, Jan. 9–12, 1989.

"A Decade of Progress in High Temperature Johnson Noise Thermometry," by T.V. Blalock et al., *American Institute of Physics*, 1982 pp. 1219–1223.

"Sensor and Device Diagnostics for Predictive and Proactive Maintenance", by B. Boynton, *A Paper Presented at the Electric Power Research Institute—Fossil Plant Maintenance Conference* in Baltimore, Maryland, Jul. 29–Aug. 1, 1996, pp. 50–1–50–6.

"Detection of Hot Spots in Thin Metal Films Using an Ultra Sensitive Dual Channel Noise Measurement System," by G.H. Massiha et al., *Energy and Information Technologies in the Southeast*, vol. 3 of 3, Apr. 1989, pp. 1310–1314.

"Detecting Blockage in Process Connection of Differential Pressure Transmitters", by E. Taya et al., *SICE*, 1995, pp. 1605–1608.

"Development and Application of Neural Network Algorithms For Process Diagnostics," by B.R. Upadhyaya et al., *Proceedings of the 29th Conference on Decision and Control*, 1990, pp. 3277–3282.

"A Fault–Tolerant Interface for Self–Validating Sensors", by M.P. Henry, *Colloquium*, pp. 3/1–3/2 (Nov. 1990).

"Fuzzy Logic and Artificial Neural Networks for Nuclear Power Plant Applications," by R.C. Berkan et al., *Proceedings of the American Power Conference*.

"Fuzzy Logic and Neural Network Applications to Fault Diagnosis", by P. Frank et al., *International Journal of Approximate Reasoning*, (1997), pp. 68–88.

"Keynote Paper: Hardware Compilation–A New Technique for Rapid Prototyping of Digital Systems–Applied to Sensor Validation", by M.P. Henry, *Control Eng. Practice*, vol. 3, No. 7., pp. 907–924, (1995).

"The Implications of Digital Communications on Sensor Validation", by M. Henry et al., *Report No. QUEL 1912/92*, (1992).

"In–Situ Response Time Testing of Thermocouples", *ISA*, by H.M. Hashemian et al., Paper No. 89–0056, pp. 587–593, (1989).

"An Integrated Architecture For Signal Validation in Power Plants," by B.R. Upadhyaya et al., *Third IEEE International Symposium on Intelligent Control*, Aug. 24–26, 1988, pp. 1–6.

"Integration of Multiple Signal Validation Modules for Sensor Monitoring," by B. Upadhyaya et al., *Department of Nuclear Engineering*, Jul. 8, 1990, pp. 1–6.

"Intelligent Behavior for Self–Validating Sensors", by M.P. Henry, *Advances In Measurement*, pp. 1–7, (May 1990).

"Measurement of the Temperature Fluctuation in a Resistor Generating 1/F Fluctuation," by S. Hashiguchi, *Japanese Journal of Applied Physics*, vol. 22, No. 5, Part 2, May 1983, pp. L284–L286.

"Check of Semiconductor Thermal Resistance Elements by the Method of Noise Thermometry", by A. B. Kisilevskii et al., *Measurement Techniques*, vol. 25, No. 3, Mar. 1982, New York, USA, pp. 244–246.

"Neural Networks for Sensor Validation and Plant Monitoring," by B. Upadhyaya, *International Fast Reactor Safety Meeting*, Aug. 12–16, 1990, pp. 2–10.

"Neural Networks for Sensor Validation and Plantwide Monitoring," by E. Eryurek, 1992.

"A New Method of Johnson Noise Thermometry", by C.J. Borkowski et al., *Rev. Sci. Instrum.*, vol. 45, No. 2, (Feb. 1974) pp. 151–162.

"Thermcouple Continuity Checker," IBM Technical Disclosure Bulletin, vol. 20, No. 5, pp. 1954 (Oct. 1977).

"A Self–Validating Thermocouple," Janice C–Y et al., IEEE Transactions on Control Systems Technology, vol. 5, No. 2, pp. 239–253 (Mar. 1997).

*Instrument Engineers' Handbook*, Chapter IV entitled "Temperature Measurements," by T.J. Claggett, pp. 266–333 (1982).

"emWare's Releases EMIT 3.0, Allowing Manufactures to Internet and Network Enable Devices Royalty Free," 3 pages, PR Newswire (Nov. 4, 1998).

Warrior, J., "The IEEE P1451.1 Object Model Network Independent Interfaces for Sensors and Actuators," pp. 1–14, Rosemount Inc. (1997).

Warrior, J., "The Collision Between the Web and Plant Floor Automation," $6^{Th}$. WWW Conference Workshop on Embedded Web Technology, Santa Clara, CA (Apr. 7, 1997).

Microsoft Press Computer Dictionary, $3^{rd}$ Edition, p. 124.

"Internal Statistical Quality Control for Quality Monitoring Instruments", by P. Girling et al., *ISA*, 15 pgs., 1999.

Web Pages from www.triant.com (3 pgs.).

"Statistical Process Control (Practice Guide Series Book)", *Instrument Society of America*, 1995, pp. 1–58 and 169–204.

"Time–Frequency Anlaysis of Transient Pressure Signals for a Mechanical Heart Valve Cavitation Study," *ASAIO Journal*, by Alex A. Yu et al., vol. 44, No. 5, pp. M475–M479, (Sep.–Oct. 1998).

"Transient Pressure Signals in Mechanical Heart Valve Caviation," by Z.J. Wu et al., pp. M555–M561 (undated).

"Caviation in Pumps, Pipes and Valves," *Process Engineering*, by Dr. Ronald Young, pp. 47 and 49 (Jan. 1990).

"Quantification of Heart Valve Cavitation Based on High Fidelity Pressure Measurements," *Advances in Bioengineering 1994*, by Laura A. Garrison et al., BED–vol. 28, pp. 297–298 (Nov. 6–11, 1994).

"Monitoring and Diagnosis of Cavitation in Pumps and Valves Using the Wigner Distribution," *Hydroaccoustic Facilities, Instrumentation, and Experimental Techniques*, NCA–vol. 10, pp. 31–36 (1991).

"Self–Diagnosing Intelligent Motors: A Key Enabler for Next Generation Manufacturing System," by Fred M. Discenzo et al., pp. 3/1–3/4 (1999).

"A Microcomputer–Based Instrument for Applications in Platinum Resistance Thermomety," by H. Rosemary Taylor and Hector A. Navarro, Journal of Physics E. Scientific Instrument, vol. 16, No. 11, pp. 1100–1104 (1983).

"Experience in Using Estelle for the Specification and Verification of a Fieldbus Protocol: FIP," by Barretto et al., Computer Networking, pp. 295–304 (1990).

"Computer Simulation of H1 Field Bus Transmission," by Utsumi et al., Advances in Instrumentation and Control, vol. 46, Part 2, pp. 1815–1827 (1991).

"Progress in Fieldbus Developments for Measuring and Control Application," by A. Schwaier, Sensor and Actuators, pp. 115–119 (1991).

"Ein Emultationssystem zur Leistungsanalysee von Feldbussystemen, Teil 1," by R. Hoyer, pp. 335–336 (1991).

"Simulatore Integrato: Controllo su bus di campo," by Barabino et al., Automazione e Strumentazione, pp. 85–91 (Oct. 1993).

"Ein Modulares, verteiltes Diagnose–Expertensystem für die Fehlerdiagnose in lokalen Netzen," by Jürgen M. Schröder, pp. 557–565 (1990).

"Fault Diagnosis of Fieldbus Systems," by Jürgen Quade, pp. 577–581 (Oct. 1992).

"Ziele und Anwendungen von Feldbussystemen," by T. Pfeifer et al., pp. 549–557 (Oct. 1987).

"PROFIBUS Infrastructure Measures," by Tilo Pfeifer et al., pp. 416–419 (Aug. 1991).

"Simulation the Time Behaviour of Fieldbus Systems," by O. Schnelle, pp. 440–442 (1991).

"Modélisation et simulation d'un bus de terrain: FIP," by Song et al, pp. 5–9 (undated).

"Field Bus Networks for Automation Systems Containing Intelligent Functional Unites," by W. Kriesel et al., pp. 486–489 (1987).

"Field Bus for Process Interconnection with Digital Control Systems," Tecnologia, pp. 141–147 (1990).

"Decentralised Systems with Real–Time Field Bus," Netzwerke, Jg. Nr.3 v. 14.3, 4 pages (1990).

"Process Measurement and Analysis," by Liptak et al., Instrument Engineers' Handbook, Third Edition, pp. 528–530, (1995).

"Improving Dynamic Performance of Temperature Sensors With Fuzzy Control Techniques," by Wang Lei et al., pp. 872–873 (1992).

"Microsoft Press Computer Dictionary" 2nd Edition, 1994, Microsoft Press. p. 156.

Copy of International Search Report from Application No. PCT/US01/40791 with international filing date of May 22, 2001.

Copy of International Search Report from Application No. PCT/US01/40782 with international filing date of May 22, 2001.

Copy of International Search Report from Application No. PCT/02/14560 with international filing date of May 8, 2002.

Copy of International Search Report from Application No. PCT/US02/14934 with international filing date of May 8, 2002.

"On–Line Tool Condition Monitoring System With Wavelet Fuzzy Neural Network," by Li Xiaoli et al., pp. 271–276 (1997).

"Optimal Design of the Coils of An Electromagnetic Flow Meter," by Michalski, A. et al., IEEE Transactions on Magnetics, vol. 34, Issue 5, Part 1, pp. 2563–2566 (1998).

"Magnetic Fluid Flow Meter for Gases," Popa, N.C., IEEE Transactions on Magnetics, vol. 30 Issue 2, Part 1–2, pp. 936–938 (1993).

"New Approach to A Main Error Estimation for Primary Transducer of Electromagnetic Flow Meter," by Michalski, A., IEEE Instrumentation and Measurement Technology Conference Proceedings, vol. 2, pp. 1093–1097 (1998).

"Additional Information From Flowmeters Via Signal Analysis," by Amadi–Echendu, J.E. et al., IEEE Instrumentation and Measurement Technology Conference Record, vol. 7, pp. 187–193 (1990).

Copy of International Search Report from Application No. PCT/US02/06606 with international filing date of Mar. 5, 2002.

Copy of International Search Report form Application No. PCT/US02/30465 with international filing date of Sep. 25, 2002.

"What is a weighted moving average?", *DAU STAT REFRESHER*, http://cne.gmu.edu/modules/dau/stat/myaygs/wma_html. (1995).

Search Report "Notification of Transmittal of The International Search Report or the Declaration", PCT/US2004/025289.

"Notification of Transmittal of The International Search Report or the Declaration", PCT/US2004/017300.

"Notification of Transmittal of The International Search Report or the Declaration", PCT/US2004/025291.*

* cited by examiner

PROCESS DEVICE WITH QUIESCENT CURRENT DIAGNOSTICS

BACKGROUND OF THE INVENTION

The present invention relates to process devices of the type used in industrial processes. More particularly, the present invention relates to diagnostics of such process devices.

Field devices such as process controllers, monitors and transmitters, are used in the process control industry to remotely control or sense a process variable. For example, a process variable may be transmitted to a control room by a transmitter for use in controlling the process or for providing information about process operation to a controller. For example, information related to pressure of process fluid may be transmitted to a control room and used to control the process, such as oil refining.

One typical prior art technique for transmitting information involves controlling the amount of power flowing through a process control loop. Current is supplied from a current source in the control room and the transmitter controls the current from its location in the field. For example, a 4 mA signal can be used to indicate a zero reading and a 20 mA signal can be used to indicate a full scale reading. More recently, transmitters have employed digital circuitry which communicates with the control room using a digital signal which is superimposed onto the analog current signal flowing through the process control loop. One example of such a technique is the HART® communication protocol proposed by Rosemount Inc. The HART® protocol and other such protocols typically include a set of commands or instructions which can be sent to the transmitter to elicit a desired response, such as transmitter control or interrogation.

Fieldbus is a communications protocol proposed by the Fieldbus Foundation and is directed to defining a communications layer or protocol for transmitting information on a process control loop. In the Fieldbus protocol, the current flowing through the loop is not used to transmit an analog signal. Instead, all information is digitally transmitted. Further, the Fieldbus standard, and a standard known as Profibus, allow transmitters to be configured in a multi-drop configuration in which more than one transmitter is connected on the same process control loop. Other communication protocols include the MODBUS® protocol and Ethernet. In some configurations, two, three, four or any number of wires can be used to connect to the process device, including non-physical connections such as RF (radio frequency).

It is often desirable to monitor operation of process devices. One device which provides built-in test equipment is shown in U.S. Pat. No. 5,481,200 entitled FIELD TRANSMITTER BUILT-IN TEST EQUIPMENT.

When a process device fails, it is often necessary to shut down the entire process so that the failed device can be repaired or replaced. Typically, it is not possible to predict an impending failure of a process device prior to its occurrence. Thus, when the process device does fail, it occurs unexpectedly, and may require the unexpected shut down of the entire process. Although various attempts have been made at predicting an impending failure prior to its occurrence, there is an ongoing need for such a technique. Prior prediction of a pending failure allows the failing device to be replaced as desired prior to its ultimate failure.

SUMMARY

A process device for use on an industrial process control system includes a connection configured to couple to a process control loop. Quiescent current draw of the process device is monitored. Diagnostic circuitry determines or predicts a diagnostic condition of the process transmitter as a function of the quiescent current.

DETAILED DESCRIPTION

The present invention provides a diagnostic technique for predicting a failure of a process device prior to the occurrence of the failure. With the present invention, quiescent current draw is monitored. Changes in the quiescent current draw are detected and used to predict an impending failure of the process device.

Figure 1:
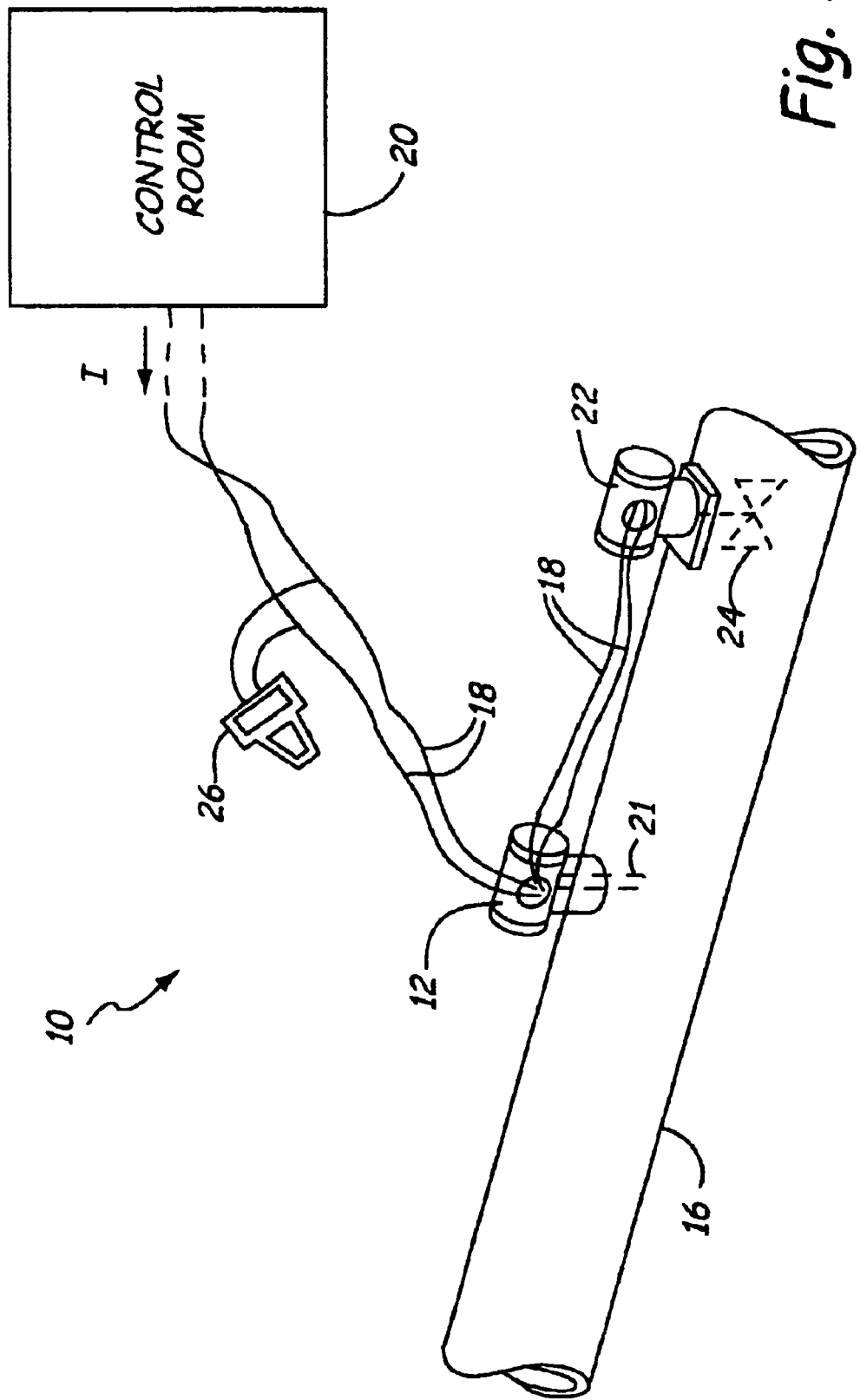
FIG. 1 is a diagram of a process control system including a transmitter in accordance with the present invention.

FIG. 1 is a diagram of process control system 10 which includes a transmitter 12 connected to process pipe 16. As discussed below, transmitter 12 is one type of process device and the present invention is applicable to any process device. Transmitter 12 is coupled to a two-wire process control loop which operates in accordance with the Fieldbus, Profibus or HART® standard. However, the invention is not limited to these standards or a two-wire configuration. Two-wire process control loop 18 runs between transmitter 12 and the control room 20. In an embodiment in which loop 18 operates in accordance with the HART® protocol. Loop 18 can carry a current I which is representative of a sensed process variable. Additionally, the HART® protocol allows a digital signal to be superimposed on the current through loop 18 such that digital information can be sent to or received from transmitter 12. When operating in accordance with the Fieldbus standard, loop 18 carries a digital signal and can be coupled to multiple field devices such as other transmitters.

Figure 2:
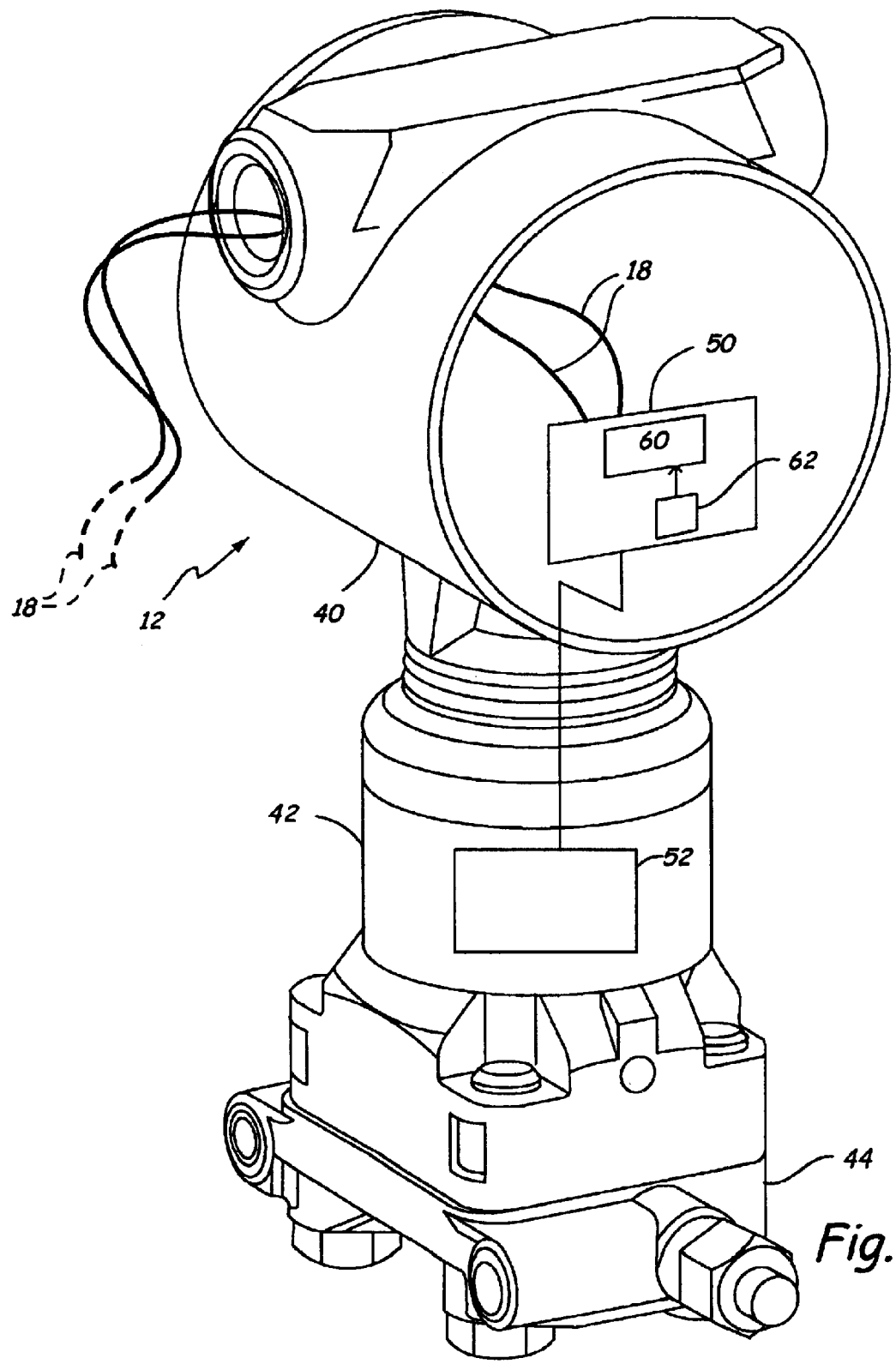
FIG. 2 is a perspective view of the transmitter shown in FIG. 1.

FIG. 2 is a perspective view of transmitter 12 which shows one example configuration of internal circuitry blocks carried therein. Transmitter 12 includes a feature module 40 which couples to a sensing module 42. The sensing module 42 couples to process piping 16 (not shown in FIG. 2) through manifold process coupling 44.

Feature module 40 includes feature module electronic circuitry 50 which couples to sensing module electronic circuitry 52 carried in sensing module 42. Typically, the sensing module electronic circuitry 52 couples to a process variable sensor which is used to sense a process variable related to operation of the process. Feature module electronic circuitry 50 includes a diagnostic module 60 which couples to a quiescent current sensor 62. The diagnostic module 60 can be implemented in hardware, software or a hybrid combination of the two. Quiescent current sensor 62 can be configured to monitor the total quiescent current drawn by transmitter 12, the quiescent current drawn by feature module electronic circuitry 50 and/or the quiescent current draw by sensing module electronic circuitry 52.

Predictive diagnostics can provide a significant benefit in the process control industry. Predictive diagnostics provide advanced knowledge of an impending failure. A sensor 21 is shown generically in FIG. 1 and couples to transmitter 12. FIG. 1 also shows a process controller 22 coupled to a control element 24 such as a valve. A process monitor 26 is also shown coupled to loop 18. The process monitor 26 is shown as a handheld device, however, the monitor 26 can also be a field mounting device. The process monitor provides visibility (access) to the diagnostic prediction that maintenance is recommended. This gives the operator opportunity to conduct maintenance prior to the ultimate failure of the device. This allows the maintenance to be conducted on a desired schedule and does not require the process to be shut down at an inopportune time. This results in increased plant availability and improved efficiency. The present invention provides a method and apparatus to monitor the health of electronic assemblies in a field device by detecting changes in the quiescent current. Such changes are used to predict and alert an operator if there is a degradation of an electronic component or other fault which causes increased current consumption.

The present invention monitors changes in the quiescent current, for example gradual increases in the quiescent current, to detect the onset of failure in transmitter electronics. For example, latent failures due to electrostatic discharge (ESD) damage, component damage due to lightning or transient events, leakage in semiconductors (for example Zener diodes), leakage in a filter component (for example capacitors), or leakage due to dendritic growth or corrosion can be detected based upon changes in the quiescent current.

In process control devices which are powered on a two wire process control loop, the quiescent operating current is a critical parameter. Examples of standards used with two wire process control loop include the HART® standard and the Fieldbus standard. Transmitters control the current flowing through the process control loop to provide an indication related to a sensed process variable. A basic premise of such devices is that they cannot regulate the loop current to a value which is less than the quiescent current required by the device. Various activities during operation of a process device can change the current drawn, for example, modulating a digital signal on to the current loop or drawing additional current during a high power operation such as writing to a non-volatile memory (such as an EEPROM). Transmitters can also regulate the current to fixed values in order to indicate the occurrence of a particular condition. For example, certain transmitters provide a low current output to indicate an alarm condition, such as 3.6 milliamps. An alarm condition can be any event which is detected by the transmitter which is preconfigured to cause an alarm condition output.

In one example, when such a transmitter is measuring the level of a tank, and the tank is nominally half-full, a 12 milliamp output current is provided. The quiescent current draw of the transmitter is 3.0 milliamps. With such a configuration, the device will be able to achieve the low alarm setting of 3.6 milliamps. Further, communication in accordance with the HART® protocol can also occur.

However, when the circuitry in the transmitter is damaged, for example by a lightning strike or other event, and the quiescent current required by the transmitter rises to 3.5 milliamps, the transmitter will not be able to transmit the low alarm signal of 3.6 milliamps without affecting any HART® digital communications. The HART® communications will not have sufficient head room (HART® protocol requires ±0.5 mA modulation for communication) beyond the quiescent current draw. For example, the digital signal used in HART® transmissions will be "clipped" such that it has an average value which is not zero. This will introduce an error into the analog current level. Further, queries (typically in a digital format) sent to the transmitter may be unsuccessful.

If the quiescent current draw continues to rise and reaches 3.9 milliamps, the transmitter will not even be able to transmit the low alarm signal of 3.6 milliamps because this would bring the total current draw below the new quiescent current value. Continued HART® communication attempts will also be unsuccessful.

This situation can be further exacerbated if the transmitter quiescent current rises above 4 milliamps. In such a situation, if the transmitter attempts to transmit the low alarm signal of 3.6 milliamps or any current below the quiescent current value, the actual current transmitted approximates the quiescent value. As currents between 4 and 20 mA are used to indicate the expected range of process variables and the transmitted current in this scenario exceeds 4 mA, an improper indication of normal operation is provided.

In each of these situations, it is unlikely that an operator will recognize the degradation to the transmitter because the transmitter will provide an appropriate output of 12 milliamps during nominal conditions in which the tank is half-full. The quiescent current problem will only be identified during a fault condition that requires the signaling of the low alarm value of 3.6 milliamps or when any value below the quiescent current level is required.

With the present invention, the quiescent current drawn by the transmitter is monitored, and if desired, trends are observed in the current draw. In the above failure scenario, when the transmitter detects a failure or impending failure, the transmitter can set the current in the loop to a high alarm value, rather than the low alarm value. The high alarm value can be used to indicate the quiescent current diagnostics determined that the transmitter is failing or predicted to fail. Alternatively, a digital signal can be transmitted to indicate such a failure. Other example failures which can be detected as increases in the quiescent current include component degradation, dendritic growth or similar faults to thereby provide an early warning of an impending failure.

In one example diagnostic technique, the quiescent current draw is compared to a base line acceptable current draw. Other values which can be used in comparisons include a running or windowed average, a nominal value or a trend. For example, the base line can be characterized over a temperature range during commissioning or manufacture of a transmitter and stored in memory as a reference. Expert systems or other techniques can be used, including neural networks or fuzzy logic, to identify such trends.

In transmitters which are of modular design, for example the transmitter 12 shown in FIG. 2, the baselines for the various modules can be generated separately. For example, a base line quiescent current draw for the sensing module 42 and the feature module 40 can be configured separately. In another example embodiment, once the modules are assembled, the feature module electronics 50 can be used to measure the quiescent current draw of the sensing module electronics 52. This allows the feature module electronics 50 to calibrate the measured quiescent current reading to the base line data during commissioning. Another alternative includes calibrating the feature module electronics 50 and the sensing module electronics 52 to a standard calibration for temperature effects, for example derived from test data.

The quiescent current can be measured using any appropriate technique. In one example embodiment, the transmitter measures current draw by monitoring the voltage drop across a current senseor resistor. The current draw can also be inferred from multiple measurements such as voltage drops or current draws of multiple components. Such a current sensor may exist in the circuitry used to power the various modules or may be added as an additional component. The quiescent current draw of the feature module electronics 50 can also be determined by measuring the voltage drop across a current sensor resistor or by measuring the total quiescent current draw of the transmitter 12 and subtracting the measured quiescent current draw of the sensing module electronics 52.

The quiescent current diagnostic techniques of the present invention can also be used for predicting communication difficulties or communication impending failures. For example, as the quiescent current draw increases, distortion occurs in the communication signal due to insufficient current head room carried on the two wire process control loop 18. Foundation Fieldbus for example requires a minimum of ±8 mA modulation for communication. Prior to generation of such errors, the transmitter can provide a diagnostic output indicative of the impending failure. This configuration can be particularly advantageous in devices which communicate exclusively in a digital format. On such a device, if the quiescent current draw prevents transmission of a digital signal, the device has no other means by which to transmit diagnostic information. Therefore, with such a configuration, the process device can transmit an indication of an impending failure, prior to ultimate failure. In another example, the device can activate circuitry to disconnect itself from the communication for the process control loop. For example, if the quiescent current draw of the device has reached or is training in a direction in which the loop will cease to function, the device can transmit a warning of impending failure and/or disconnect itself from the loop such that the loop can continue to operate.

The quiescent measurement circuitry can be implemented using any appropriate technique such as an analog to digital converter which measures a voltage drop across a current sensor resistor. The output of the analog to digital converter can be provided to a microprocessor which implements the diagnostic function. For example, the measured quiescent current draw can be compared against a stored value and compensated based upon temperature or other factors. In some embodiments, the microprocessor may control electronics, within the transmitter to compensate for the increased quiescent current draw. For example, power can be removed from certain electronic components such that the transmitter can continue functioning despite the occurrence of a component failure. This would allow an operator additional time to replace the malfunctioning device.

Figure 3:
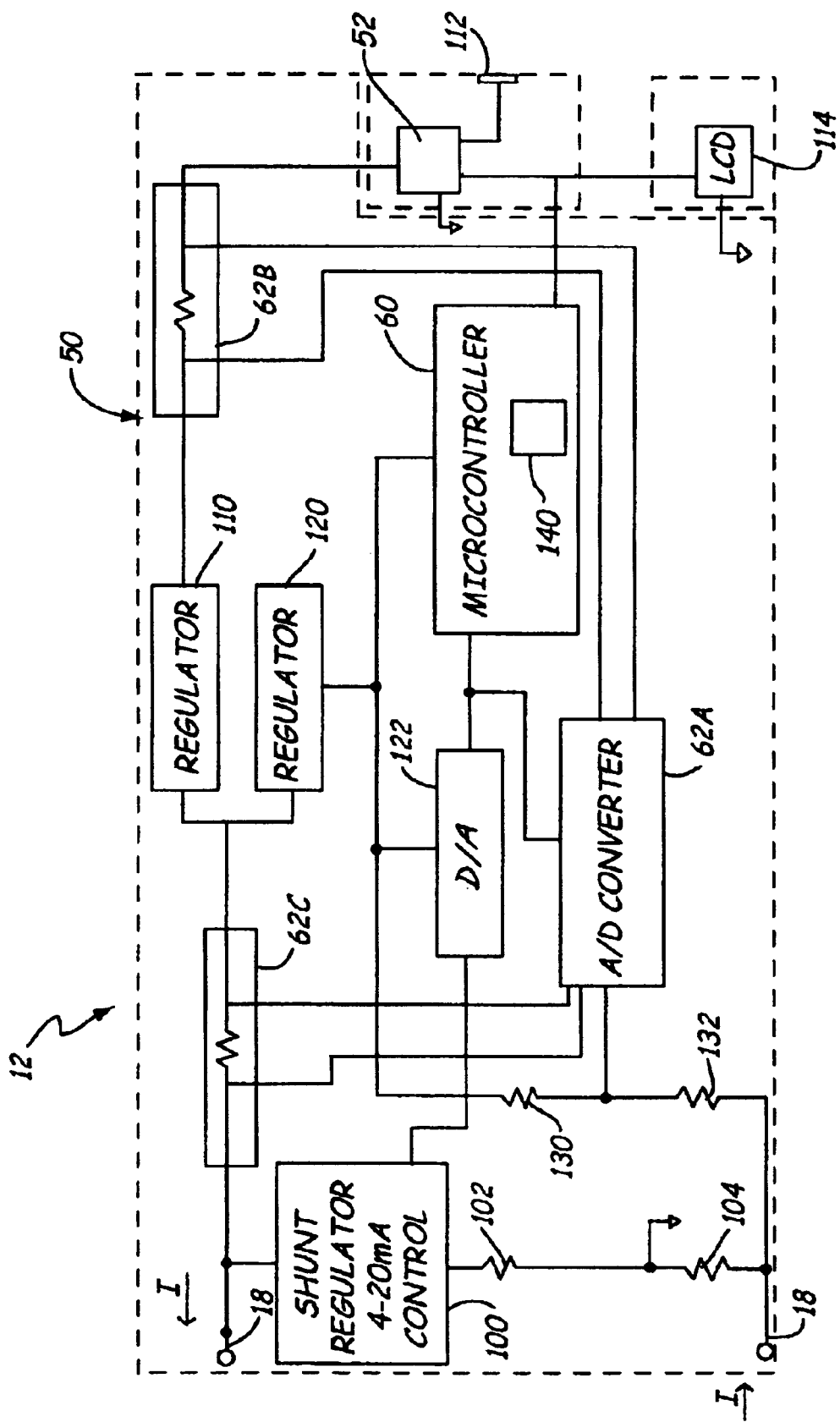
FIGS. 3 and 4 are simplified electrical block diagrams showing components in the transmitter of FIG. 1 used in quiescent current measurement and diagnostics.

FIG. 3 is a simplified block diagram showing circuitry in transmitter 12. In FIG. 3, feature module electronic 50 is shown coupled to two wire process control loop 18 through a series regulator resistor 62C, a shunt regulator 100, a resistor 102 and a loop readback 104. A sensing module power regulator 110 couples to sensing module electronics 52 through a sensing module current regulator resistor 62B. Sensing module electronics 52 is also shown coupled to the process through a process variable sensor 112. An optional output display 114 is also provided.

The diagnostic circuitry is implemented as microcontroller 60 which couples to a feature module power regulator 120, a digital to analog converter 122 and an analog to digital converter 62A. Analog to digital converter 62A couples to resistors 62B and 62C and is configured to measure the loop current through the connection to resistors 130 and 132.

In operation, the microcontroller 60 is configured to control the current I through loop 18, and any digital data modulated onto that current, using D/A 122 and shunt regulator 100. The analog to digital converter 62A provides an output which is indicative of the current flowing I through loop 18. Further, analog to digital converter 62A can provide an output to microcontroller 60 which is related to the voltage drop across resistor 62C. This voltage drop is related to the quiescent current draw of all circuitry and transmitter 12. Similarly, the analog to digital converter 62A can provide an output related to the voltage drop across resistor 62B which is indicative of quiescent draw of the sensing module electronics 52. The microcontroller 60 includes a memory 140 which contains base line data regarding the quiescent current draw the various components. By periodically comparing the measured quiescent current draw with the quiescent current draw stored in memory 140, the microcontroller can determine if the quiescent current draw has exceeded specification. As discussed above, the stored quiescent current draw can be characterized based upon transmitter temperature or other measurements.

Upon the detection of an aberration in the quiescent current draw, the microcontroller can transmit a warning on process control loop 18 or display an output on display 114 or some other type of visual output. The output can be a digital signal or the current I on loop 18 can be set to a fixed current level.

As discussed above, the present invention is applicable to any process device which is used in a process control environment. In general, process control devices, such as transmitter 12 shown in FIG. 1 are used to monitor or control process variables.

Process variables are typically the primary variables which are being controlled in a process. As used herein, process variable means any variable which describes the condition of the process such as, for example, pressure, flow, temperature, product level, pH, turbidity, vibration, position, motor current, any other characteristic of the process, etc. Control signal means any signal (other than a process variable) which is used to control the process. For example, control signal means a desired process variable value (i.e. a setpoint) such as a desired temperature, pressure, flow, product level, pH or turbidity, etc., which is adjusted by a controller or used to control the process. Additionally, a control signal means, calibration values, alarms, alarm conditions, the signal which is provided to a control element such as a valve position signal which is provided to a valve actuator, an energy level which is provided to a heating element, a solenoid on/off signal, etc., or any other signal which relates to control of the process. A diagnostic signal as used herein includes information related to operation of devices and elements in the process control loop, but does not include process variables or control signals. For example, diagnostic signals include valve stem position, applied torque or force, actuator pressure, pressure of a pressurized gas used to actuate a valve, electrical voltage, current, power, resistance, capacitance, inductance, device temperature, stiction, friction, full on and off positions, travel, frequency, amplitude, spectrum and spectral components, stiffness, electric or magnetic field strength, duration, intensity, motion, electric motor back emf, motor current, loop related parameters (such as control loop resistance, voltage, or current), or any other parameter which may be detected or measured in the system. Furthermore, process signal means any signal which is related to the process or element in the process such as, for example, a process variable, a control signal or a diagnostic signal. Process devices include any device which forms part of or couples to a process control loop and is used in the control or monitoring of a process.

As discussed above, FIG. 1 is a diagram showing an example of a process control system 10 which includes process piping 16 which carries a process fluid and two wire process control loop 18 carrying loop current I. A transmitter 12, controller 22, which couples to a final control element in the loop such as an actuator, valve, a pump, motor or solenoid, communicator 26, and control room 20 are all part of process control loop 18. It is understood that loop 18 is shown in one configuration and any appropriate process control loop may be used such as a 4–20 mA loop, 2, 3 or 4 wire loop, multi-drop loop and a loop operating in accordance with the HART®, Fieldbus or other digital or analog communication protocol. In operation, transmitter 12 senses a process variable such as flow using sensor 21 and transmits the sensed process variable over loop 18. The process variable may be received by controller/valve actuator 22, communicator 26 and/or control room equipment 20. Controller 22 is shown coupled to valve 24 and is capable of controlling the process by adjusting valve 24 thereby changing the flow in pipe 16. Controller 22 receives a control input over loop 18 from, for example, control room 20, transmitter 12 or communicator 26 and responsively adjusts valve 24. In another embodiment, controller 22 internally generates the control signal based upon process signals received over loop 18. Communicator 26 may be the portable communicator shown in FIG. 1 or may be a permanently mounted process unit which monitors the process and performs computations. Process devices include, for example, transmitter 12 (such as a 3095 transmitter available from Rosemount Inc.), controller 22, communicator 26 and control room 20 shown in FIG. 1. Another type of process device is a PC, programmable logic unit (PLC) or other computer coupled to the loop using appropriate I/O circuitry to allow monitoring, managing, and/or transmitting on the loop.

Any of the process devices 12, 22, 26 or 20 shown in FIG. 1 may include a diagnostic capability in accordance with the present invention.

Figure 4:
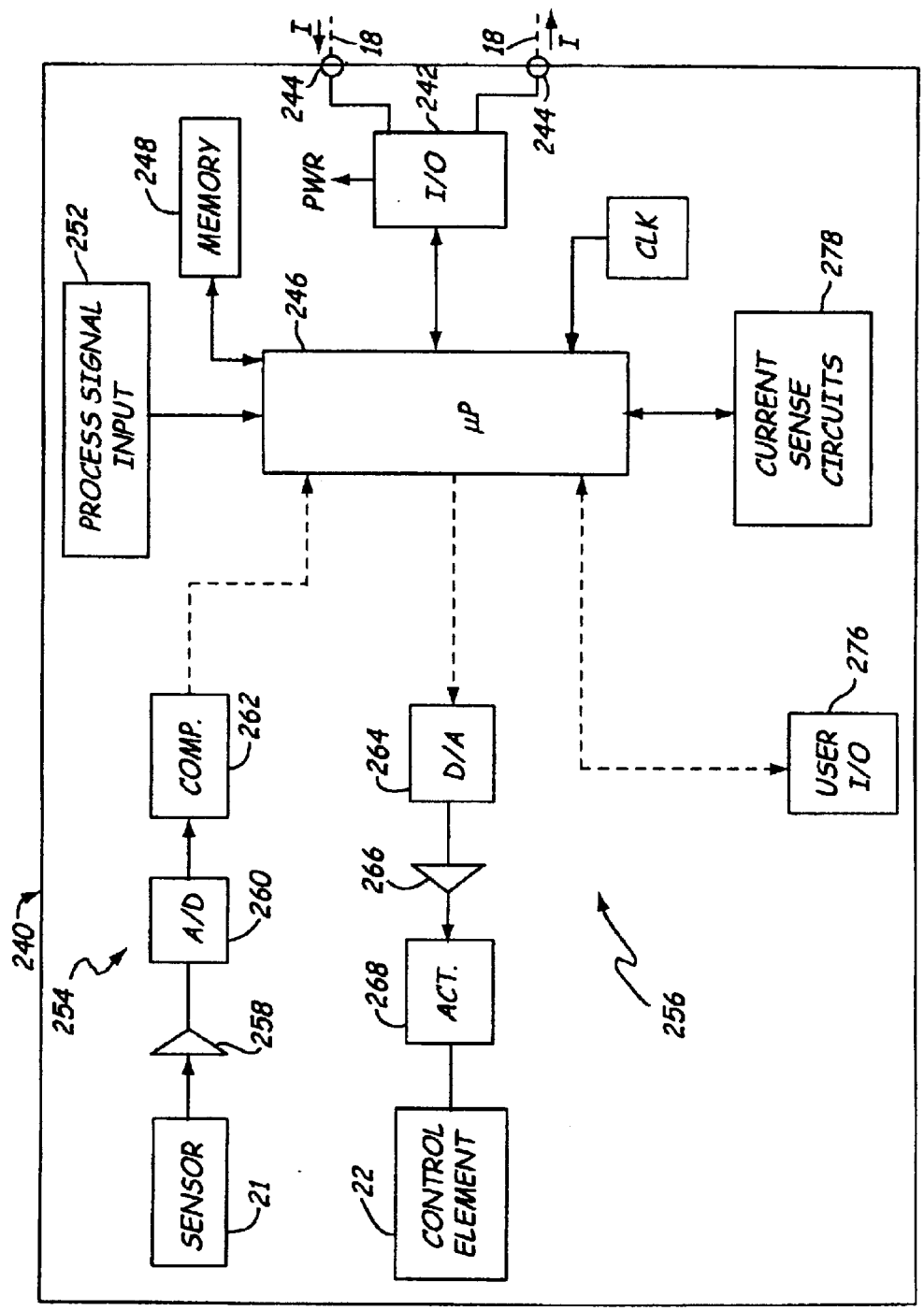

FIG. 4 is a block diagram of a process device 240 forming part of loop 18. Device 240 is shown generically and may comprise any process device such as transmitter 12, controller 22, communicator 26 or control room equipment 20 shown in FIG. 1. Control room equipment 20 may comprise, for example, a DCS system implemented with a PLC and controller 22 may also comprise a "smart" motor and pump. Process device 240 includes I/O circuitry 242 coupled to loop 18 at terminals 244. I/O circuitry has preselected input and output impedance known in the art to facilitate appropriate communication from and to device 240. Device 240 includes microprocessor 246, coupled to I/O circuitry 242, memory 248 coupled to microprocessor 246 and clock 250 coupled to microprocessor 246. Microprocessor 246 receives a process signal input 252. Block input is intended to signify input of any process signal, and as explained above, the process signal input may be a process variable, or a control signal and may be received from loop 18 using I/O circuitry 242 or may be generated internally within field device 240. Field device 240 is shown with a sensor input channel 254 and a control channel 256. Typically, a transmitter such as transmitter 12 will exclusively include sensor input channel 254 while a controller such as controller 22 will exclusively include a control channel 256. Other devices on loop 18 such as communicator 26 and control room equipment 20 may not include channels 254 and 256. It is understood that device 240 may contain a plurality of channels to monitor a plurality of process variables and/or control a plurality of control elements as appropriate.

Sensor input channel 254 includes sensor 21, sensing a process variable and providing a sensor output to amplifier 258 which has an output which is digitized by analog to digital converter 260. Channel 254 is typically used in transmitters such as transmitter 12. Compensation circuitry 262 compensates the digitized signal and provides a digitized process variable signal to microprocessor 246. In one embodiment, channel 254 comprises a diagnostic channel which receives a diagnostic signal.

When process device 240 operates as a controller such as controller 22, device 240 includes control channel 256 having control element 24 such as a valve, for example. Control element 24 is coupled to microprocessor 246 through digital to analog converter 264, amplifier 266 and actuator 268. Digital to analog converter 264 digitizes a command output from microprocessor 246 which is amplified by amplifier 266. Actuator 268 controls the control element 24 based upon the output from amplifier 266. In one embodiment, actuator 268 is coupled directly to loop 18 and controls a source of pressurized gas (not shown) to position control element 24 in response to the current I flowing through loop 18. In one embodiment, controller 22 includes control channel 256 to control a control element and also includes sensor input channel 254 which provides a diagnostic signal such as valve stem position, force, torque, actuator pressure, pressure of a source of pressurized air, etc.

In one embodiment, I/O circuitry 242 provides a power output used to completely power other circuitry in process device 240 using power received from loop 18. Typically, field devices such as transmitter 12, or controller 22 are powered off the loop 18 while communicator 26 or control room 20 has a separate power source. As described above, process signal input 252 provides a process signal to microprocessor 246. The process signal may be a process variable from sensor 21, the control output provided to control element 24, a diagnostic signal sensed by sensor 21, or a control signal, process variable or diagnostic signal received over loop 18, or a process signal received or generated by some other means such as another I/O channel.

A user I/O circuit 276 is also connected to microprocessor 246 and provides communication between device 240 and a user. Typically, user I/O circuit 276 includes a display and audio for output and a keypad for input. Typically, communicator 26 and control room 20 includes I/O circuit 276 which allows a user to monitor and input process signals such as process variables, control signals (setpoints, calibration values, alarms, alarm conditions, etc.). A user may also use circuit 276 in communicator 26 or control room 20 to send and receive such process signals to transmitter 12 and controller 22 over loop 18. Further, such circuitry could be directly implemented in transmitter 12, controller 22 or any other process device 240.

FIG. 4 also illustrates a quiescent current sense circuitry 278. The quiescent current sense circuitry can be an individual current sensor, or it can be formed from multiple sensors, or sensors in which current draw is inferred. The sense circuitry couples to microprocessor 246. Microprocessor 246 can monitor the quiescent current output circuitry 278 and provide an indication of a failure or impending failure. For example, the microprocessor can compare the quiescent current to a baseline value or a nominal value. This information can be stored in memory 248. The baseline and nominal values can change based upon the mode of operation of the process device 240, or other factors. Further, the diagnostics performed by microprocessor 246 can be based upon trends in the quiescent current. For example, an increase, either gradual or suddenly over time, or periodic spikes or other anomalies in the quiescent current draw, can be an indication of an impending failure. Similarly, if the quiescent current suddenly spikes, the microprocessor 246 can provide a diagnostic output indicating that the process device 240 temporarily failed. These values, trends, or training profiles can also be stored in memory 248. The diagnostics can be based upon a simple comparison, or more complex mathematical techniques such as observing averages or rolling averages of measurements, fuzzy logic techniques, neural network techniques, or expert system techniques based upon a series of rules and/or threshold comparison. The ability of the present invention to provide predictive diagnostics can be advantageous because it provides time for service personnel to service the process device 240 prior to its ultimate failure. Further, some types of process devices may simply go offline when they ultimately fail. Such a device provides no output which indicates that it is in failure mode and therefore the operator is now alerted that a failure has occurred.

The present invention can also be implemented in wireless devices used in process control systems. In such a device, power must be supplied through an internal power source. Such devices can be particularly power sensitive. With the present invention, for example, measurement circuitry, or other circuitry within the device, can be shut down such that the wireless device has sufficient power to communicate and provide an output indicating that a component has failed or is in the process of failing.

The diagnostic output of the present invention can be used to provide an output signal, provide a visual indication to an operator, provide a communication signal for transmission to a control room, operate to disconnect the circuitry responsible for the increased quiescent current draw, or other circuitry of the device, disconnect the process device from the process control loop, or take other actions.

Although the present invention has been described with reference to preferred embodiments, workers skilled in the art will recognize that changes may be made in form and detail without departing from the spirit and scope of the invention. The diagnostic circuitry can monitor quiescent current draw of all circuitry in the transmitter, or just subcircuitry within the transmitter. As used herein, quiescent current includes normal current draw along with any undesired current draw due to leakage, failing or failed components, etc. The above description illustrates the invention in one example configuration and any appropriate process control loop may be used such as 4–20 mA, 2, 3, or 4 wire loop multi-drop loop and a loop operating in accordance with HART®, Fieldbus or other digital or analog communication protocol.

What is claimed is:

1. A process device for use on an industrial process control system, comprising:
   an electrical connection configured to couple to a process control loop;
   output circuitry configured to transmit data on the process control loop;
   a quiescent current sensor configured to sense quiescent current draw of the process device; and
   diagnostic circuitry configured to determine a diagnostic condition of the process device as a function of the sensed quiescent current.

2. The apparatus of claim 1 including a memory which contains a nominal quiescent current value.

3. The apparatus of claim 1 including a memory which contains a baseline value.

4. The apparatus of claim 1 wherein the diagnostic condition is a function of temperature.

5. The apparatus of claim 2 wherein the nominal quiescent current stored in the memory is a function of temperature.

6. The apparatus of claim 3 wherein the baseline value stored in the memory is a function of temperature.

7. The apparatus of claim 1 wherein the quiescent current sensor is configured to sense the quiescent current draw of a subcircuit within the process device.

8. The apparatus of claim 1 wherein the quiescent current sensor includes a sense resistor.

9. The apparatus of claim 1 wherein the quiescent current sensor includes an analog to digital converter.

10. The apparatus of claim 1 wherein the process device is configured to provide an output signal on the process control loop.

11. The apparatus of claim 10 wherein the output signal comprises an analog signal.

12. The apparatus of claim 10 wherein the output signal comprises a digital signal.

13. The apparatus of claim 1 wherein the diagnostic circuitry monitors trends in the quiescent current draw.

14. The apparatus of claim 1 including feature module electronic circuitry and wherein the quiescent current sensor is configured to sense the quiescent current draw of the feature module electronic circuitry.

15. The apparatus of claim 1 including sensing module electronic circuitry and wherein the quiescent current sensor is configured to sense the quiescent current draw of the sensing module electronic circuitry.

16. The apparatus of claim 1 wherein the output circuitry provides an output on the process control loop based upon the diagnostic condition determined by the diagnostic circuitry.

17. The apparatus of claim 16 wherein the output comprises an alarm signal.

18. The apparatus of claim 1 wherein the diagnostic condition is indicative of an impending failure of electronic circuitry in the process device.

19. The apparatus of claim 1 wherein the process control loop comprises a two-wire process control loop.

20. The apparatus of claim 1 wherein the diagnostic circuitry controls operation of electronic circuitry in the transmitter in response to the sensed quiescent current draw of the process device.

21. The apparatus of claim 1 including a visual output and wherein the diagnostic circuitry provides an output on the visual output in response to the diagnostic condition.

22. The apparatus of claim 1 wherein the diagnostic circuitry includes a digital processor.

23. The apparatus of claim 1 wherein the process device is completely with power received through the process control loop.

24. The apparatus of claim 1 wherein the process control loop operates in accordance with HART®, Fieldbus or Profibus.

25. The apparatus of claim 1 including a process variable input coupled to a sensor for sensing process variable of an industrial process.

26. The apparatus of claim 1 including a control output coupled to a control element for controlling a process variable of the process control system.

27. The apparatus of claim 1 wherein the process control loop is selected from the group of process control loops consisting of two-wire loops, three-wire loops and four-wire loops and wireless loops.

28. A method of determining a diagnostic condition of a process device of the type used in industrial process control systems, comprising:

coupling the process device to a process control loop;

outputting data on the process control loop;

monitoring quiescent current draw of electrical components of the process device; and diagnosing a condition of the electrical component of the process device based upon the monitored quiescent current.

29. The method of claim 28 including comprising the measured quiescent current draw with a nominal quiescent current value.

30. The method of claim 28 including a memory which contains a baseline value.

31. The method of claim 30 wherein the baseline value stored in the memory is a function of temperature.

32. The method of claim 28 wherein the diagnostic condition is a function of temperature.

33. The method of claim 29 wherein the nominal quiescent current draw is a function of temperature.

34. The method of claim 28 wherein the monitored quiescent current draw is the quiescent current draw of a subcircuit within the transmitter.

35. The method of claim 28 including monitoring trends in the quiescent current draw.

36. The method of claim 28 wherein the diagnostic condition is indicative of an impending failure of electronic circuitry in the transmitter.

37. The method of claim 28 including controlling operation of electronic circuitry in the process device in response to the sensed quiescent current draw of the transmitter.

38. The method of claim 28 including completely powering the transmitter with power received from the two-wire process control loop.

39. The method of claim 28 wherein the process control loop comprises a two-wire process control loop.

40. The method of claim 28 including sensing a process variable of the industrial process.

41. The method of claim 28 including providing a control output to a control element to control operation of an industrial process.

42. The method of claim 28 wherein the process control loop is selected from the group of process control loops consisting of two-wire loops, three-wire loops, four-wire loops and wireless loops.

* * * * *